(12) United States Patent
Speers

(10) Patent No.: US 8,040,151 B2
(45) Date of Patent: Oct. 18, 2011

(54) PROGRAMMABLE LOGIC DEVICE WITH PROGRAMMABLE WAKEUP PINS

(75) Inventor: Theodore Speers, San Jose, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 12/340,440

(22) Filed: Dec. 19, 2008

(65) Prior Publication Data

US 2010/0156458 A1    Jun. 24, 2010

(51) Int. Cl.
*H03K 19/173* (2006.01)
(52) U.S. Cl. .............. 326/38; 326/33; 326/39; 326/47
(58) Field of Classification Search .............. None
See application file for complete search history.

(56) References Cited

U.S. PATENT DOCUMENTS

| | | | |
|---|---|---|---|
| 5,216,674 A | 6/1993 | Peter et al. | |
| 5,784,639 A * | 7/1998 | Abramson | 712/23 |
| 6,433,584 B1 | 8/2002 | Hatae | |
| 6,622,251 B1 | 9/2003 | Lindskog et al. | |
| 6,637,017 B1 | 10/2003 | Brophy | |
| 7,263,564 B2 * | 8/2007 | Chen et al. | 710/19 |
| 2002/0135398 A1 * | 9/2002 | Choi et al. | 326/93 |
| 2008/0030235 A1 | 2/2008 | Sun et al. | |
| 2008/0098246 A1 * | 4/2008 | Kim | 713/323 |

FOREIGN PATENT DOCUMENTS

WO    2007/008579 A2    1/2007

OTHER PUBLICATIONS

International Search Report and Written Opinion mailed Mar. 1, 2010 in corresponding International Patent Application No. PCT/US2009/068856, 8 pages.
"IGLOO Industry's Lowest-Power FPGAs," URL http://www.actel.com/products/iglooseries/default.aspx, Actel Corporation, 6 pages, Mountain View, CA, USA.
"Actel's Flash*Freeze Technology and Low-Power Modes," IGLOO® Handbook, Actel Corporation, Date Unknown, pp. 1-24, Mountain View, CA, USA.
"Cyclone III FPGAs-Optimized for Low Power," URL http://www.altera.com/products/devices/cyclone3/overview/power/cy3-power.html, date unknown, printed Mar. 17, 2009, Altera Corporation, 2 pages, San Jose, CA, USA.
"Delivering the World's First Low-Cost 65-nm FPGAs," URL http://www.altera.com/products/devices/cyclone3/overview/power/cy3-power.html, Altera Corporation, date unknown, print Mar. 17, 2009, 2 pages, San Jose, CA, USA.
"Achieving Low Power in 65-nm Cyclone III FPGAs,", White Paper, Apr. 2007, ver. 1.1, Altera Corporation, 7 pages, San Jose, CA, USA.

(Continued)

*Primary Examiner* — Shawki Ismail
*Assistant Examiner* — Jany Tran
(74) *Attorney, Agent, or Firm* — Lewis and Roca LLP

(57) ABSTRACT

A programmable logic device (PLD) adapted to enter a low-power or sleep mode with programmable wakeup pins in a wakeup group of pins is disclosed. Wake on a single pin change, wake on vector, and wake on a single pin transition are supported. The approach is to select the actively participating pins, enable the desired operation, define the wakeup condition, enter sleep mode, monitor the external signals coupled to the active pins, and exit sleep mode when the wakeup condition is detected.

14 Claims, 7 Drawing Sheets

OTHER PUBLICATIONS

"MachXO—Most Versatile Non-Volatile PLD for Low-Density Applications," MachXO The All-in-One PLD, URL http://www.latticesemi.com/products/cpldspld/machxo/index.cfm, Lattice Semiconductors, Inc., date unknown, printed Mar. 17, 2009, 3 pages, Hillsborogh, Or, USA.

"Sleep Mode Reduces Standby Power to <100 μA," URL http://www.latticesemi.com/products/cpldspld/machxo/sleepmodereducesstbypower.cfm, Lattice Semiconductor, Inc., date unknown, printed Mar. 17, 2009, 1 page, Hillsborogh, OR, USA.

"QuickLogic PolarPro™ Family Datasheet," QuickLogic Corporation, 2007, pages: cover page and 35-36 of 101 pages, most relevant, Sunnyvale, CA, USA.

"Minimizing Energy Consumption with Very Low Power Mode in PolarPro FPGAs," QuickLogic® Application Note 88, QuickLogic Corporation, 2006, 9 pages, Sunnyvale, CA, USA.

"ArcticLink™ Programmable Connectivity Solution Platform," ArcticLink Solution Platform Product Brief, QuickLogic Corporation, Feb. 2007, 6 pages, Sunnyvale, CA, USA.

"CoolRunner-II CPLD Family," DS090 (V3.0) Product Specification, Xilinx, Inc., Mar. 8, 2007, 16 pages, San Jose, CA, USA.

"Power Management Solutions," Spartan-3 Generation FPGA User Guide, Chapter 19, UG331 (v1.3), Xilinx, Inc., Feb. 14, 2008, pp. 483-502, San Jose, CA, USA.

"Using Suspend Mode in Spartan-3 Generation FPGAs", Application Note: Spartan-3A,Spartan-3AN, Spartan-3A DSP, XAPP480 (v1.0), Xilinix, Inc., May 2, 2007, 18 pages, San Jose, CA, USA.

"MSP430X47X3, MSP430X47X4 Mixed Signal Microcontroller," SLAS545A, Texas Instruments, Inc., May 2007, Revised Dec. 2007, 76 pages, Dallas, TX, USA.

Tuan, Tim et al., "A 90nm Low-Power FPGA for Battery-Powered Applications," Fourteenth ACM/SIGDA International symposium on Field-Programmable Gate Arrays, Monterey, California, Feb. 22-24, 2006, 9 pages, ACM, Inc., USA.

Office Action dated Apr. 9, 2010 in co-pending U.S. Appl. No. 12/340,358 entitled "PLD Providing Soft Wakeup Logic" filed Dec. 19, 2008, 37 pages.

* cited by examiner

PROGRAMMABLE LOGIC DEVICE WITH PROGRAMMABLE WAKEUP PINS

BACKGROUND OF THE INVENTION

1. Field of the Invention

The Present invention relates to the field of integrated circuits. In particular, it relates to power management in programmable logic integrated circuit devices.

2. The Prior Art

Programmable Logic Devices (PLDs) are known in the art. A PLD is an integrated circuit having a programmable logic core comprising uncommitted logic and routing resources that is able to implement an arbitrary end user design up to the logic capacity of the device. PLDs come in a number of types with Field Programmable Gate Arrays ("FPGAs") being the variety with the largest logic capacity and highest performance in commercially available devices, which typically makes them the flagship product lines of PLD manufacturers. Since high capacity and high performance typically result in high power consumption, the present invention is preferably applied to FPGAs, though the inventive principles herein apply to all classes of PLD.

An FPGA comprises circuitry to implement any number of initially uncommitted logic modules arranged in an array along with an appropriate amount of initially uncommitted routing resources. Logic modules are circuits which can be configured to perform a variety of logic functions, for example, AND-gates, OR-gates, NAND-gates, NOR-gates, XOR-gates, XNOR-gates, inverters, multiplexers, adders, latches, and flip/flops. Routing resources can include a mix of components, for example, wires, switches, multiplexers, and buffers. Logic modules, routing resources, and other features, for example, user I/O buffers and memory blocks, are the programmable elements of the FPGA.

The programmable elements have associated control elements (sometimes known as programming bits or configuration bits) that determine their functionality. The control elements may be thought of as binary bits having values such as on/off, conductive/non-conductive, true/false, or logic-1/logic-0 depending on the context. Depending on the technology employed different numbers and types of circuit elements are used to create a control element. For example, to connect two circuit nodes an antifuse, a floating gate transistor, or an SRAM bit controlling a pass transistor may be used as one type of control element in their respective technologies. Or to create a programmable logic-0/logic-1 generator to control a logic circuit, a single SRAM bit, programming one of two floating gate transistors (one coupled to logic-0 and one coupled to logic-1), or programming one of two antifuses (one coupled to logic-0 and one coupled to logic-1) may be used as a second type of control element in their respective technologies. Other types of control elements are possible and the above examples are not limiting in any way.

The characteristics of the control elements vary according to the technology employed and their mode of data storage may be either volatile or non-volatile. Volatile control elements, for example, SRAM bits, lose their programming data when the FPGA power supply is disconnected, disabled or turned off. Non-volatile control elements, for example, antifuses and floating gate transistors, do not lose their programming data when the FPGA power supply is removed. Some control elements, such as antifuses, can be programmed only one time and cannot be erased. Other control elements, such as SRAM bits and floating gate transistors, can have their programming data erased and may be reprogrammed many times. The detailed circuit implementation of the logic modules and routing resources can vary greatly and is appropriate for the type of control element used.

Like most integrated circuits, FPGAs typically have an input/output (I/O) ring surrounding a programmable core, though other approaches are possible. The I/O ring contains bonding pads and input and output buffers that interface to circuits external to the FPGA as well as power supply and ground connections. Some of the input and output buffers are typically dedicated to control functions. Others are programmable elements that can be part of an end user's design. It is common for the programmable element inputs and outputs (also called user inputs or user input buffers and user outputs or user output buffers) to pair equal numbers of input buffers and output buffers together to form input/output buffers (also called I/O buffers or user I/O buffers or user I/Os or sometimes simply I/Os). In some FPGAs, one or more of the inputs, outputs, or I/Os can be shared between user design functions and control functions.

The logic design programmed into an FPGA by the end user is typically implemented by use of a computer program product (also known as software or, more specifically, design software) produced by the PLD manufacturer and distributed by means of a computer-readable medium, for example, providing a CD-ROM to the end user or making the design software downloadable over the internet. Typically the manufacturer supplies a library of design elements as part of the computer program product. The library design elements provide a layer of insulation between the end user and the circuit details of the FPGA features available to the end user, for example, logic modules, memory blocks and programmable delay lines. This makes the design software easier to use for the end user and simplifies the manufacturer's task of processing the end user's design by the various tools in the design software.

Typically, a user creates a logic design using the manufacturer-supplied design software. The design software then takes the completed design and converts it into the appropriate mix of configured logic modules and other programmable elements, maps them into physical locations inside the FPGA, configures the interconnect to route the signals from one programmable element to another, and generates the data structure necessary to assign values to the various control elements inside the FPGA.

As semiconductor processing technology has advanced in recent years, transistor dimensions have continued to decrease. As a consequence, operating voltages for these small geometry transistors have also typically dropped—though this trend has slowed in the last few process nodes (130 nm, 90 nm and 65 nm) since the gate oxide thickness of the devices has not been scaled with the lateral transistor geometries in order to maintain operating voltages in the 1.0 volt to 1.2 volt range. The result has been transistors with very thin gate oxide layers, very short channel lengths, and low threshold voltages, which produce substantially more leakage current than in previous generations. This has resulted in the static current of a CMOS integrated circuit typically becoming a substantial portion (and occasionally the majority) of the entire power budget. Dynamic power is also on the rise due to the ever increasing numbers of transistors that can be fit into an integrated circuit unmitigated by the traditional decreases in operating voltage.

As integrated circuit power has been rising, consumer demand for hand-held, battery-powered devices has been increasing. Power reduction is critical in such applications because battery life is a key component of both product usefulness and consumer acceptance. Even in non-portable systems, power reduction is becoming a key issue in new electronic products by both semiconductor and systems manufacturers due to a variety of environmental concerns.

As a consequence, PLD manufacturers have been attempting to lower the power of their parts and there have been a number of different families of PLDs and FPGAs that have one or more modes with reduced power combined with reduced functionality (sometimes called a "low-power" mode or a "power-down" mode or a "sleep" mode). The parts can be placed in one of these modes to reduce power when normal operation is not required.

FIG. 1 shows a system using an FPGA of the prior art. In FIG. 1, FPGA 100 comprises FPGA core 102 where the large majority of the FPGA's programmable elements are located and the majority of the end user's design is programmed, and a power control block 104 that handles the necessary control functions for putting the part into a low-power or sleep mode (i.e., reducing some or all functionality of the circuit in order to reduce power consumption) and subsequently waking it up (i.e., restoring functionality not available in the sleep mode). User logic 106 is programmed into the FPGA core 102. There is a source of external system control logic 108 coupled to the power control block 104 in FPGA 100 by interconnect 110 through input buffer 112. In order for the external system control logic 108 to place FPGA 100 into sleep mode or to wake it up, a signal is asserted on interconnect 110.

One drawback of this approach is there is no means of communication between power control block 104 and user logic 106. This means that there is no way for the FPGA 100 to shut itself down in an orderly fashion relative to whatever is transpiring in user logic 106 at the time the sleep mode request is received. To achieve an orderly shutdown by stopping clocks and preserving the contents of sequential elements (like, for example, latches, registers, internal SRAM blocks, etc.) inside FPGA core 102, then at least one optional interconnect 114 is coupled between external system control logic 108 and user logic 106 through at least one input buffer 116. This means that the designer of external system logic 108 is familiar enough with the workings of user logic 106 to correctly generate the signals on optional interconnects 114 relative to the signal on interconnect 110. In a similar manner, when coming out of sleep mode, external system logic 108 must correctly generate the signals on interconnect 110 and optional interconnects 114 in order to perform an orderly wakeup before starting normal operation.

A second drawback of the approach of FIG. 1 is the inherent lack of flexibility. In the FPGAs of the prior art, input buffer 112 is a dedicated input that is used to initiate transitions into and out of sleep mode. This can be problematic, particularly in applications when multiple sources of stimuli are monitored to initiate those transitions.

One commercial family using the general approach of FIG. 1 is the Spartan 3 family of FPGAs from Xilinx, Inc. of San Jose, Calif., that have both a "suspend" mode and a "hibernate" mode. In suspend mode, all of the SRAM configuration bits and the various sequential elements (latches, flip/flops, SRAM blocks, etc.) keep their logic states and some sources of quiescent power are turned off in response to a single pin. In hibernate mode, external power switches are placed between the system power supplies and some or all (depending on the part) of the power supply pins of the FPGA effectively isolating them from the system (not shown in FIG. 1). Another commercial family using the FIG. 1 approach is the MachXO PLD family from Lattice Semiconductor Corporation of Hillsborough, Oreg. The MachXO family has a low power mode where the power is reduced and the user logic is not functional in response to a single pin.

FIG. 2 shows a system using another FPGA of the prior art. In FIG. 2, FPGA 200 comprises an FPGA core 202 and a power control block 204. User logic 206 is programmed into the FPGA core 202. There is a source of external system control logic 208 coupled to the power control block 204 in FPGA 200 by interconnect 210 through input buffer 212. In FPGA 200, the output of input buffer 212 also couples to user logic 206 in FPGA core 202. In order coordinate an orderly transition into a sleep mode, one or more interconnects 218 are coupled between power control 204 and user logic 206 in FPGA core 204.

This approach overcomes the first drawback to the FPGA architecture of FIG. 1, since only a single interconnect line is coupled between external system control logic 208 and FPGA 200. When the external system control logic 208 signals FPGA 200 to go into a low-power or sleep mode, user logic 206 can monitor the signal, place itself in a state appropriate for an orderly shutdown, communicate back and forth with power control block 204 on interconnects 218, and then turn control over the power control block 204 to place FPGA 200 in a low-power or sleep mode. To wake up FPGA 200, power control block 204 receives a signal on interconnect 210 and wakes up the FPGA 200 and initiates an orderly start up in conjunction with the user logic 206. Thus external system control logic 208 can be designed without any detailed knowledge of user logic 206.

One commercial family using the general approach of FIG. 2 is the Igloo family of FPGAs from Actel Corporation of Mountain View, Calif., which has a "flash-freeze" mode. In flash-freeze mode, the various sequential elements (latches, flip/flops, SRAM blocks, etc.) keep their logic states since the FPGA core remains powered up, however all clocks are shut off and certain circuits are placed in a low power state.

Unfortunately, the approach of FIG. 2 does little to make the use of Power Control block 204 more flexible, particularly with regards to the wakeup functionality. One of the strengths of PLDs is the ability to easily customize logic functions. However, when the FPGA 200 is in sleep mode any customized logic programmed inside of FPGA core 202 is unavailable for use in initiating the wakeup process.

Microcontrollers are known in the art. A microcontroller is a self-contained computer that typically contains a central processing unit (CPU), an adequate amount of both volatile memory (typically flash or EEPROM) and non-volatile memory (typically SRAM) for required tasks, and sufficient interface circuitry to interact with its environment and operate in a largely self-sufficient manner. Typically the non-volatile memory is used to store the software programs that the microcontroller runs during operation, though it can be used for other purposes such as data logging. Typically the volatile memory is used as a scratchpad for temporary data storage, though software can be loaded from outside the microcontroller into the SRAM and executed when necessary.

Microcontrollers are used in a wide variety of applications like automobiles, appliances, industrial controls, and handheld devices. Often times they are left idle while waiting for some input, for example, a keystroke or a button push by a human user. Often to save power the microcontroller goes into a low-power or sleep mode waiting for a hardware interrupt generated by the expected external event, typically a transition on one of a designated number of pins on the microcontroller chip itself. When an interrupt is detected, the CPU wakes up and executes the interrupt handling software for the particular pin where the transition occurred. Often, the last instructions in the interrupt handling routine will put the microcontroller back into sleep mode until the next interrupt occurs.

An example of commercial microcontrollers using this approach is the MSP340 series from Texas Instruments of Dallas, Tex. They contain a CPU, up to 60 KB of flash prom, up to 2.5 KB of SRAM, up to four analog-to-digital converters, a hardware multiplier and a variety of bus interface I/O ports—some of them general purpose and some of them compatible with a specific interface standard. Five different low power modes are supported. Two of the 8-bit general purpose bus interface I/O ports have hardware interrupt capability providing up to 16 different hardware interrupts which can be used, for example, in conjunction with the power saving modes.

While this approach works well in microcontrollers with power-down modes, the infrastructure to handle hardware interrupts in software (CPU, non-volatile memory, SRAM, address and data busses, etc.) is typically not available in other sorts of semiconductors. In particular such functionality is unavailable in field programmable gate arrays of the prior art.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

Figure 2:
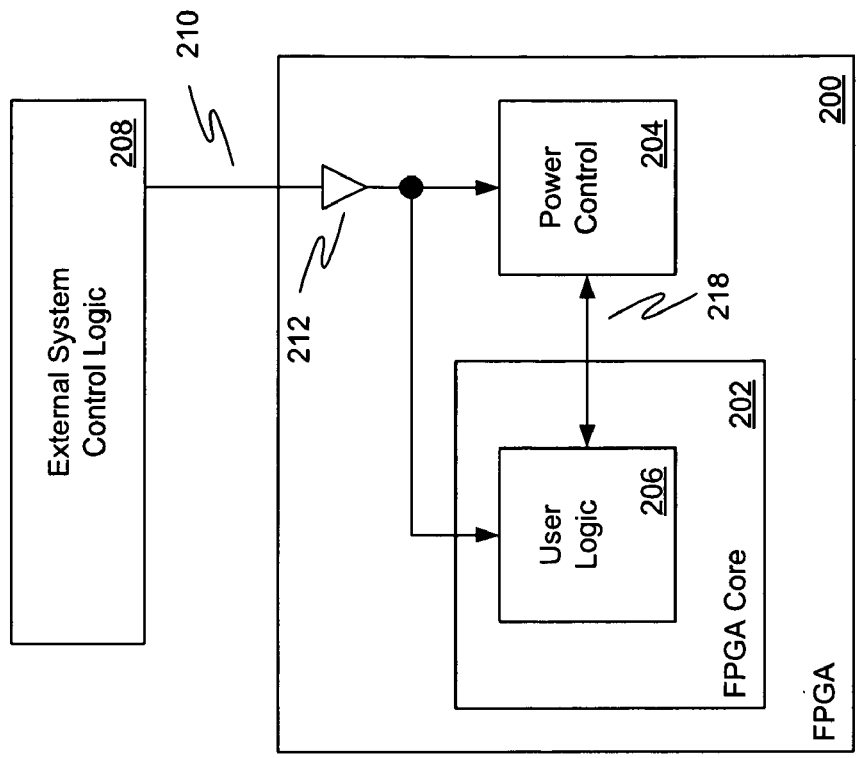
FIG. 2 illustrates another FPGA of the prior art.
Figure 1:
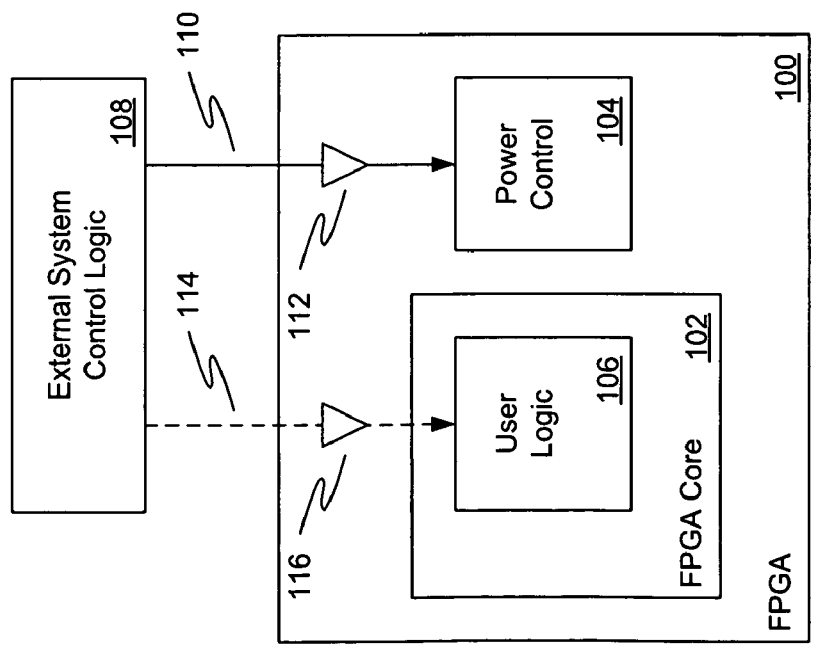
FIG. 1 illustrates an FPGA of the prior art.
Figure 3:
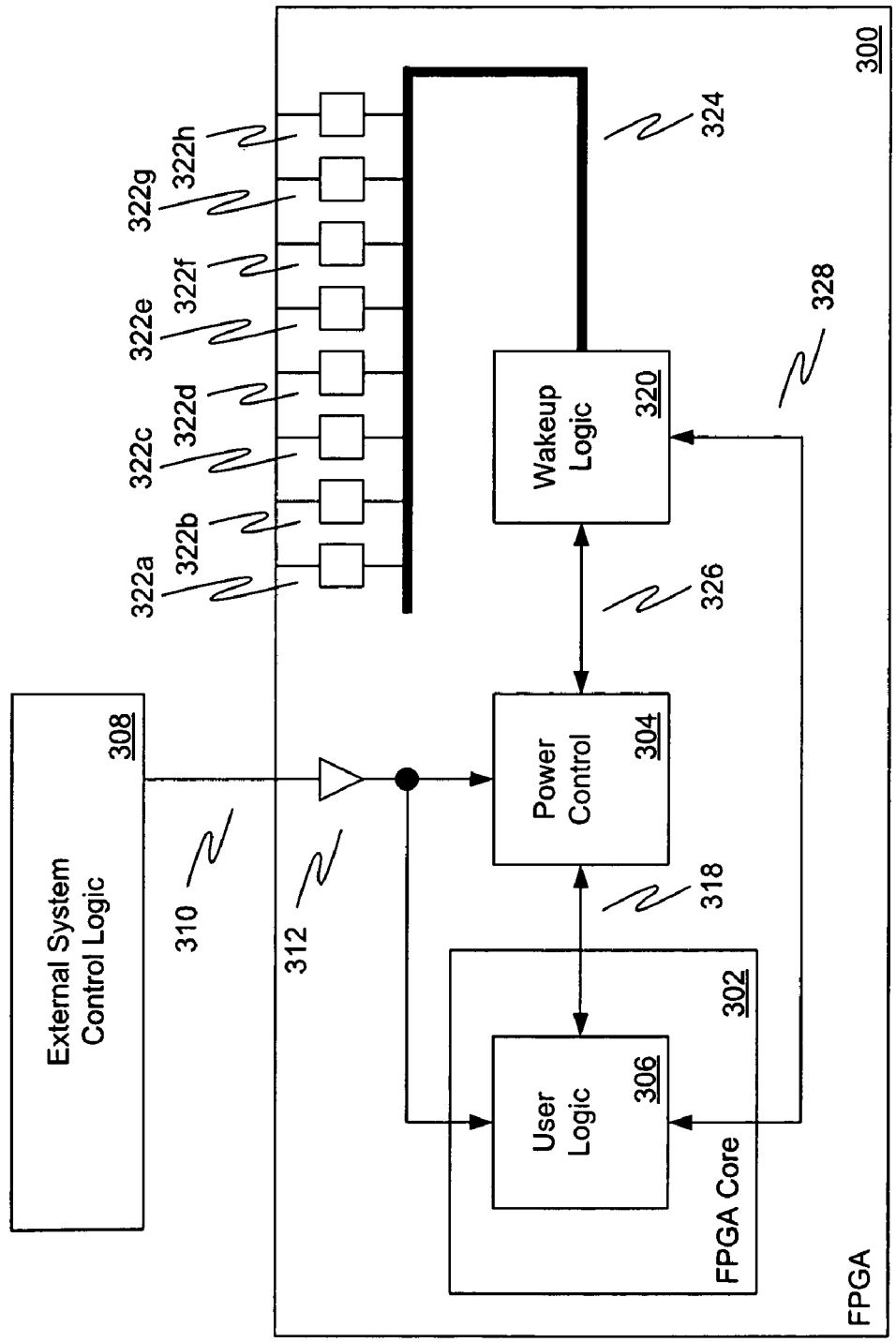
FIG. 3 illustrates an exemplary FPGA according to the present invention.

FIG. 3 shows an illustrative FPGA 300 of the present invention. In FIG. 3, FPGA 300 comprises FPGA core 302 that can be placed in a low-power or sleep mode and power control block 304. Power control block 304 is a logic circuit block that handles the various hardware functions required to enter one or more low-power or sleep modes and then subsequently wakeup, such as turning circuits with D.C. power off and then on, disconnecting and then reconnecting the power supply connections to various circuits that have significant leakage currents, and saving the state of sequential elements in circuits that are to be powered down and then back up again. The exact nature of power control block 304 will vary from embodiment to embodiment. It needs to stay powered up during a low-power mode, since it must remain functional to awaken the circuits that are powered down. It will be a hard wired circuit block where, in some embodiments, certain aspects of its behavior may be specified by the user during programming. User logic 306 is programmed into the FPGA core 302. There is a source of external system control logic 308 coupled to the power control block 304 in FPGA 300 by interconnect 310 through input buffer 312. In FPGA 300, the output of input buffer 312 also couples to user logic 306 in FPGA core 302, and one or more interconnects 318 couple between power control block 304 and user logic 306.

FPGA 300 further comprises wakeup logic 320. Wakeup logic 320 is shown coupled to eight I/O buffers 322a through 322h, known as the "wakeup group." The wakeup group is a subset of the I/O circuits on the FPGA device that are connected to (or in some cases include) wakeup logic. In the embodiment shown in FIG. 3, the wakeup group I/O buffers are connected to the wakeup logic 320 via wakeup bus 324. Wakeup bus 324 can be any of a number of bus types known in the art and the circuitry will vary from embodiment to embodiment as a matter of design choice. To facilitate the transition process into and out of sleep mode, wakeup logic 320 is coupled to power control block 304 through one or more interconnects 326 and, optionally, user logic 306 through one or more interconnects 328. In some embodiments interconnects 328 may not be present.

While eight I/O buffers 322a through 322h are shown as part of the wakeup group in FIG. 3, persons of ordinary skill in the art will realize the choice of eight is illustrative only and any number of input buffers may be used. While such I/O buffers could be dedicated control inputs, it is preferable to use the input buffers that are part of the many user I/O buffers present in all modern FPGAs. Persons of ordinary skill in the art will realize that bonding pads, output buffers, boundary scan registers, enable logic, any input or output registers, the connections between the user I/O buffers and FPGA core 302, etc., that would be present in a commercially viable FPGA are not shown in FIG. 3 to avoid cluttering the diagram and overcomplicating the disclosure. In some embodiments it is desirable for all of the user I/O buffers to be part of the wakeup group and in some embodiments it is desirable to include dedicated control inputs such as input buffer 312 along with the user I/O buffers as part of the wakeup group.

Wakeup logic 320 is a logic circuit that performs a number of different functions to provide the end user with a substantial degree of flexibility in controlling the wakeup process of FPGA 300. Three main modes are supported: "Wake on Change," "Wake on Vector," and "Wake on Transition," although other modes are possible. Additionally there is circuitry present to determine which inputs in the wake group are actively involved with the wakeup process (and which are not), and to accept instructions from (and report status to) power control block 304 or, optionally, user logic 306. Wake up operations involve monitoring external conditions and taking user specified action when a user specified external condition (or "wakeup condition" or "wakeup event") is detected. Since every end user design is different, it is desirable to make the wakeup group as flexible as possible. Each user I/O buffer 322a through 322h in the wakeup group can be selected by the user (as part of the programming process) to be an active part of a wakeup operation.

Wake on Change operations monitor the logic values being input to the active members of the wake group during sleep mode and command power control block 304 to wake the FPGA when a change on any pin is detected. This is a desirable function to use when, for example, the expected external stimulus is something like waiting for a button to be pushed on a keypad by a human operator. In this case, the wakeup condition would be a signal originating with a mechanical button when pushed by a human finger and received at an actively participating user I/O buffers 322 in the wakeup group. Once the FPGA is awake, user logic 306 can (if programmed into the user logic 306 by the end user) directly monitor the inputs from the user I/O buffers 322a through 322h in the wake group to determine the correct course of action to be taken based on which pin changed value. If programmed into user logic 306 by the end user, the user logic 306 can then command power control block 304 and wakeup logic 320 to place the FPGA back in sleep mode to wait for the next wakeup event.

Wake on Vector operations monitor the logic values being input to the active members of the wake group during sleep mode and command power control block 304 to wake the FPGA when all of the inputs match a desired input pattern (or vector). This is a desirable function when, for example, the FPGA 300 is coupled to an address bus and needs to wakeup when its address is asserted on the bus. In this case, the wakeup condition would be a specific data pattern simultaneously received at all of the actively participating user I/O buffers 322a through 322h in the wakeup group. Once the FPGA is awake, user logic 306 can (if programmed into the user logic 306 by the end user) determine the correct course of action to be taken. If programmed into user logic 306 by the end user, the user logic 306 can then command power control block 304 and wakeup logic 320 to place the FPGA back in sleep mode to wait for the next wakeup event.

Wake on Transition operations monitor the logic values being input to the active members of the wake group during sleep mode and command power control block 304 to wake the FPGA when a logic change of the user specified polarity on any pin is detected. This is similar to the Wake on Change mode except either one of the two cases, either a logic-1 to logic-0 change (or "transition") or a logic-0 to logic-1 change (or "transition"), is specified as the wakeup event (In Wake on Change mode, only the transition away from the initial state before the low-power mode is entered is the wakeup event.) This is a desirable function when, for example, the user specified external stimulus is one or more gated clock sources where the event of interest is the active edge (or transition) rather than the value at any given time. Often in synchronous logic, only one transition of the clock is used by a logic design and the other transition is ignored. Change on Transition mode makes it easier for the end user to define wakeup conditions for this type of signal than it would be in Wake on Change mode. Once the FPGA is awake, user logic 306 can (if programmed into the user logic 306 by the end user) directly monitor the user I/O buffers in the wakeup group to determine the correct course of action to be taken based on which pin changed value. If programmed into user logic 306 by the end user, the user logic 306 can then command power control block 304 and wake control 320 to place the FPGA back in sleep mode to wait for the next wakeup event.

In FIG. 3, wakeup logic 320 is drawn as a circuit block coupled to user I/O buffers 322a through 322h through wakeup bus 324. In some embodiments of the invention, wakeup bus 324 comprises a group of interconnects each coupled to the outputs of one of the input buffers in the wakeup group. In such non-distributed embodiments, all of the wakeup logic 320 circuitry could be present in a single location on the FPGA. The larger the number of inputs in the wakeup group, the less practical this becomes. In an embodiment with an FPGA having hundreds of user I/O buffers, each of them included in the wakeup group, routing wakeup bus 324 as individual wires for individual inputs would comprise hundreds of wires and be very costly. In such an embodiment, it is more practical to dispose the part of wakeup logic 320 associated with processing the signals generated by each of the input buffers in the user I/O buffers 322 around the chip in a distributed manner, preferably placing the portion of the logic that processes each input buffer in close proximity to the associated input buffer itself. Thus the connectivity involving wakeup bus 324 in FIG. 3 should be regarded as symbolic of the functionality.

Wakeup logic 320 can be implemented as either a hardwired circuit or as soft gates programmed into FPGA core 302. In a commonly assigned patent application entitled "PLD Providing Soft Wakeup Logic," Ser. No. 12/340,358 filed on Dec. 19, 2008, the same day as this application, an FPGA with a low-power mode where some of the FPGA core is kept active is disclosed. Application Ser. No. 12/340,358, which is included in its entirety herein by reference, further describes employing user programmable logic (the "soft gates" of the title) in the always-on portion of the FPGA core to control the process of entering and exiting the FPGA from a low-power or sleep mode in various ways. Implementing the functionality of, for example, wakeup logic 320 and wakeup bus 324, in soft gates in FPGA core 302 could be accomplished by utilizing the invention disclosed in application Ser. No. 12/340,358.

Figure 4:
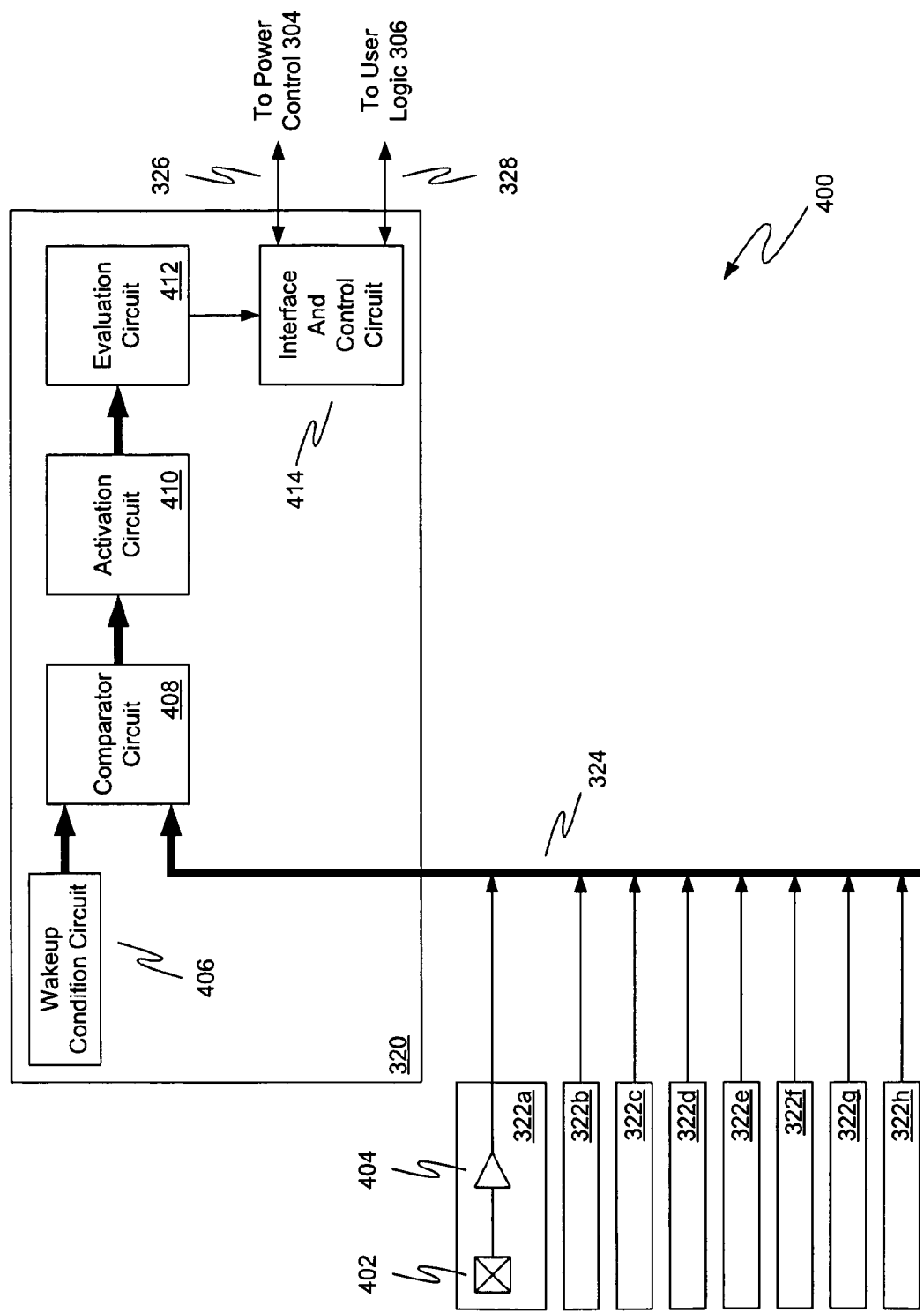
FIG. 4 illustrates an exemplary non-distributed programmable wakeup pin subsystem according to the present invention.

Turning to FIG. 4, a block diagram of a non-distributed embodiment of the programmable wakeup pin subsystem is generally indicated by reference numeral 400. Elements that have been previously described in conjunction with FIG. 3 will have the same reference numerals as in those figures. The block diagram of FIG. 4 corresponds to the non-distributed approach discussed in conjunction with FIG. 3. Present in FIG. 4 are wakeup logic 320, user I/O buffers 322a through 322h, wakeup bus 324, and interconnects 326 and 328 previously described in FIG. 3.

FIG. 4 shows eight user I/O buffers 322a through 322h with the additional details of bond pad 402 and input buffer 404 shown for instance 322a, though the additional details are also present in user I/O buffers 322b through 322h. As in FIG. 3, the choice of eight user I/O buffers 322a through 322h is illustrative only and any number may be present. Each user I/O buffer 322a through 322h has a bond pad 402 for making an electrical connection off chip. All of the input buffers 404 in the user I/O buffers 322a through 322h have an input coupled to bond pad 402 and an output coupled to wakeup bus 324 which in turn is coupled to the comparator circuit 408 in wakeup logic 320. It is worth noting that the user I/O buffers 322a through 322h of FIG. 4 can be used to replace the generic I/O buffers 322a through 322h of FIG. 3.

Comparator circuit 408 is also coupled to wakeup condition circuit 406 and activation circuit 410. Activation circuit 410 is further coupled to evaluation circuit 412. Interface and control circuit 414 is coupled to evaluation circuit 508, power control block 304 through interconnects 326 and, optionally, to user logic 306 though interconnects 328.

In the non-distributed embodiment of FIG. 4, the large majority of the circuitry required to implement wakeup functions will be present in wakeup logic 320 which can be a hardwired circuit located at one location (or possibly broken into multiple locations) away from most or all the user I/O buffers 322a through 322h in the wakeup group, or a programmable circuit in FPGA core 302 (if FPGA core 302 is active during low-power modes). In some embodiments of this type where the input buffers present in user I/O buffers generally are disabled during a low power mode, a small amount of circuitry (not shown) may be present in the user I/O buffers 322a through 322h allowing the input buffer of inactive members of the wakeup group to be disabled during a low-power mode.

Wakeup condition circuit 406 is a hardwired or programmable logic circuit containing programmable elements that contain information about the user specified wakeup condition. The associated control elements may be present in FPGA core 302 or they may be located elsewhere in the FPGA 300 as a matter of design choice. To implement a Wake on Change operation, for example, the value of the active members of the wakeup group prior to entering power-down mode would be stored so that changes to one or more of the active pins could be detected in the comparator circuit 408. To implement a Wake on Vector operation, the user specified vector would be stored so that comparator circuit 408 could detect a match between the active members of the wakeup group and the specified vector. Or to implement a Wake on Transition operation, the value of the active members of the wakeup group prior to entering power-down mode would be stored along with the information about the user specified transition. Alternatively, an edge triggered sequential element like a flip/flop may be utilized to detect the correct transition.

Comparator circuit 408 is a hardwired or programmable logic circuit performs a bit-by-bit comparison on the values input by the wakeup group and the user specified wakeup condition. Activation circuit 410 is a hardwired or programmable logic circuit that acts like a filter to block a possible positive evaluation from the comparator circuit 408 resulting from activity on an inactive member of the wakeup group.

Evaluation circuit 412 is a hardwired or programmable logic circuit that monitors the outputs of the activation circuit 410 as a whole and makes a determination as to whether a wakeup condition has been detected and passes the result to interface and control circuit 414. The wakeup condition circuit 406, the comparator circuit 408, and the activation circuit 410 perform a series of parallel operations on a bit-by-bit basis for all of the wakeup group inputs (including the inactive ones which are filtered out by activation circuit 410). Evaluation circuit 412 looks at the results of all the bit-by-bit operations and makes a high level determination of whether or not the wakeup condition has been met in light of the results from the individual operation and the expected results (which are a function of the user specified wakeup operation).

Interface and control circuit 414 is a hardwired or programmable logic circuit that provides the necessary interface between wakeup logic 320 and power control circuit 304 and, optionally, user logic 306 in FPGA core 302. This makes various features available to the user like, for example, changing the wakeup condition or operation, providing inputs from control elements in FPGA core 302, and timing the capture of the state of the active wakeup pins before entering a low-power mode.

The description of functions and interconnects of wakeup condition circuit 406, comparator circuit 408, activation circuit 410, evaluation circuit 412, and interface and control circuit 414 are illustrative of the overall functionality accomplished by wakeup logic 320. Persons of ordinary skill in the art will realize that there are many different ways to implement a logic design. Alternate implementations for the organization and function of wakeup logic 320 will readily suggest themselves to such skilled persons and the choice of the illustrative example in no way limits the inventive concepts of the present invention.

Figure 5:
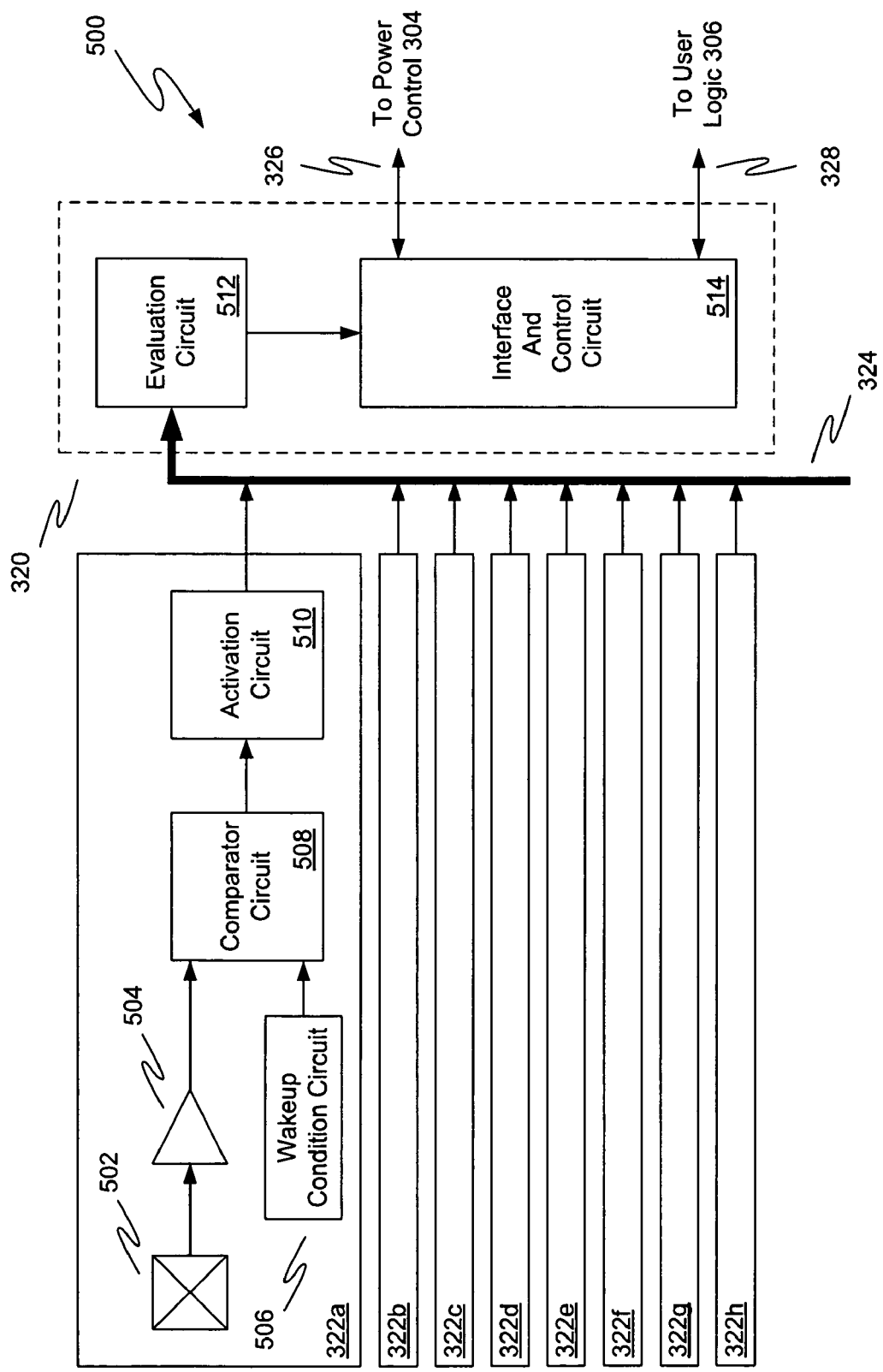
FIG. 5 illustrates an exemplary distributed programmable wakeup pin subsystem according to the present invention.

Turning to FIG. 5, a block diagram of a distributed embodiment of the programmable wakeup pin subsystem is generally indicated by reference numeral 500. This is an alternate embodiment to the non-distributed wakeup subsystem of FIG. 4. Elements that have been previously described in conjunction with FIG. 3 and FIG. 4 will have the same reference numerals as in those figures.

FIG. 5 shows a plurality of user I/O buffers 332a through 322h shown coupled to wakeup bus 324. Each user I/O buffer 332a through 322h has a bond pad 502 coupled to the input node of an input buffer 404. As in FIG. 3, the choice of eight user I/O buffers 322a through 322h is illustrative only and any number may be present. Each user I/O buffer 322a through 322h also has wakeup condition circuit 506, comparator circuit 508 coupled to wakeup criteria circuit 502 and input buffer 504, and activation circuit 510 coupled between comparator circuit 508 and wakeup bus 324. Many details that would be present in a user I/O buffer of a commercially viable FPGA have been omitted from the diagram for clarity of presentation. It is worth noting that the circuits shown in FIG. 5 labeled 322a through 322h are an alternate embodiment to the circuits labeled 322a through 322h in FIG. 4 that may be substituted for the more generic user I/O buffers 322a through 322h of FIG. 3.

Since the wakeup logic is implemented in a distributed fashion in FIG. 5, much of the functionality of wakeup logic 320 described in FIG. 4 is moved to hardwired circuits in the user I/O buffers of the wakeup group. Thus wakeup condition circuit 506 comprises circuitry to implement one bit of the functionality described in conjunction with wakeup condition circuit 406 of FIG. 4, comparator circuit 508 comprises circuitry to implement one bit of the functionality described in conjunction with comparator circuit 408 in FIG. 4, and activation circuit 510 comprises circuitry to implement one bit of the functionality described in conjunction with activation circuit 410 of FIG. 4. This leaves evaluation circuit 512 and interface and control circuit 514 in a smaller alternate embodiment of the wakeup logic circuit 320 in FIG. 5 which can be either hardwired or programmable logic circuits.

Thus in this embodiment, the output of activation circuit 510 is coupled to wakeup bus 324 that in turn is coupled to evaluation circuit 512. Evaluation circuit 512 monitors the outputs of all the activation circuits 510 as a group and makes a determination as to whether a wakeup condition has been detected and passes the result to interface and control circuit 514.

Interface and control circuit 514 provides the necessary interface between wakeup logic 320 and power control circuit 304 and, optionally, user logic 306 in FPGA core 302. This makes various features available to the user like, for example, changing the wakeup condition, providing inputs from control elements in FPGA core 302, and timing the capture of the state of the active wakeup pins before entering a low-power mode.

While all of the embodiments discussed so far have assumed a single wakeup group, the use of multiple wakeup groups is possible and within the scope of the present invention. In one approach, each set of wakeup group pins can be provided with its own separate wakeup bus 324. Alternatively, multiple wakeup busses 324 can be present and some or all of the wakeup group pins can be programmably configured to participate in all, some, one, or none of the active wakeup groups. Additional logic would have to be added to process the inputs from multiple wakeup busses 324.

One advantage of this approach would allow users to programmably select between multiple wakeup operations. For example, if two wakeup groups were active the wakeup criteria can be set to "Wake on Vector" on one group and "Wake on Pin Change" on the other. The user can then program the logic to wake on some complex conditions of these functions. For example, the user can create a wakeup criteria function like "wakeup on either a vector address in the first group OR a change in the second group."

In a commercially available FPGA, the design software provided by the PLD manufacturer will handle most of the details of implementation for the end user. The wakeup group will be determined by either instantiating special user input buffers or user I/O buffers in the design, or designating those pins as members of the wakeup group some other way, for example, by adding properties to instances of user I/O buffers or supplying a data file with the necessary information. The wakeup logic similarly may be instantiated or its operation determined by, for example, attaching properties to a more general power management block or supplying a data file.

When the end user's design is complete, the design software will process it with a variety of tools. It will be converted to programmable elements and then searched for a variety of different purposes including identifying the programmable elements that are part of the power management in general and the wakeup logic and wakeup group in particular. As part of the place and route software, these programmable elements will be mapped into the correct physical locations on the FPGA and the control data structure for programming the control elements will be generated. In a design system with an FPGA programming head attached or in a dedicated FPGA programmer, the control data structure may be programmed into an FPGA device.

Figure 6A:
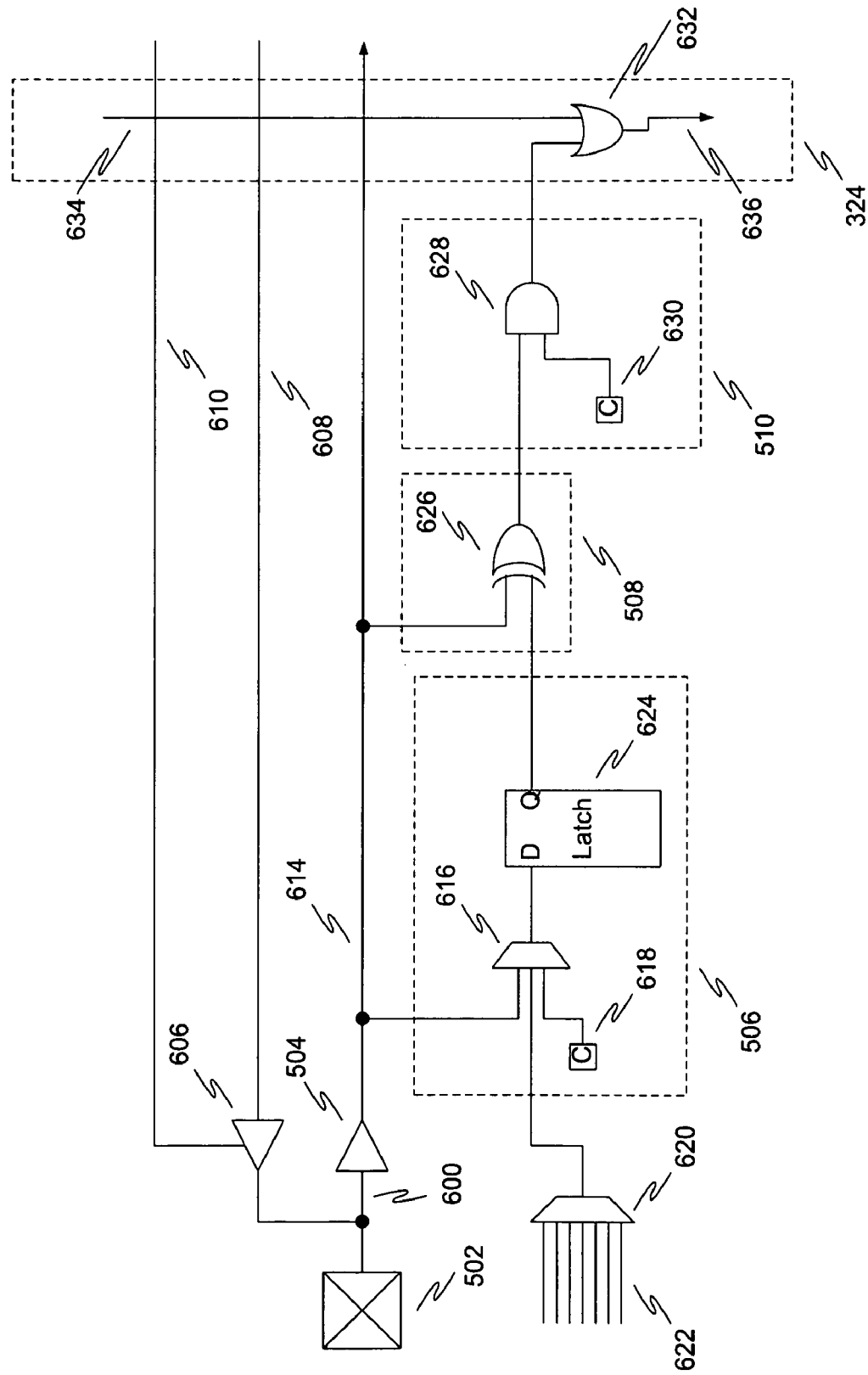
FIG. 6A illustrates a logic diagram of a first embodiment of a user I/O buffer suitable for use with the distributed subsystem of FIG. 5.

More details of an exemplary embodiment of the user I/O buffers 322*a* through 322*h* in the distributed arrangement of FIG. 5 are illustrated in FIG. 6A. Also present in FIG. 6A is bonding pad 502, previously described, that is coupled through interconnect 600 to the output node of output buffer 606. Output buffer 606 has a data input node coupled to the FPGA core 302 through user data output interconnect 608 and an enable input node coupled to the FPGA core 302 through user enable output interconnect 610. The user I/O buffer of FIG. 6A further comprises input buffer 504 which has an input node coupled to bonding pad 502 through interconnect 600 and an output node coupled to the FPGA core 302 through user data input interconnect 614. Since the wakeup function involves processing an incoming signal rather than an outgoing one it is worth noting that output buffer 606 is placed in a high impedance output state to avoid conflicts with external signals being input through bond pad 602 during low-power and sleep modes.

Persons of ordinary skill in the art will realize that many different output buffers 606 and input buffers 504 suitable for use with the present invention are known. The circuit details of output buffer 606 and input buffer 504 will thus not be discussed to avoid overcomplicating the disclosure. Such skilled persons will also realize that logic functions (not shown in FIG. 3, FIG. 4, FIG. 5 or FIG. 6A), for example, data registers, boundary scan registers, double data rate conversion circuits, etc., are often coupled between the user I/O buffers and the FPGA core 302 in commercial FPGAs. Such logic functions will not be further discussed because they are not utilized in the wakeup functionality of the present invention.

In this embodiment, wakeup condition circuit 506 of FIG. 5 comprises multiplexer 616, control element 618, and latch 624. Multiplexer 616 has a first data input coupled to user input data interconnect 614, a second data input coupled to control element 618, a third data input coupled to the output of routing multiplexer 620, and an output coupled to the D-input of latch 624. Routing multiplexer 620 has a number of data inputs coupled to routing tracks 622 in FPGA core 302. The select inputs of multiplexer 620 (not shown) come from control elements (not shown) and are programmed as part of the user design. In some embodiments multiplexer 620 could be constructed out of control elements in which case there might not be select lines in some technologies. The connectivity of the select inputs (not shown) of multiplexer 616 vary depending on the embodiment. In some embodiments, they are set by control elements (not shown). In other embodiments they are controlled by either a local control circuit inside user I/O buffer 600 (not shown) or by control circuitry located elsewhere on the PLD like in wakeup logic 320 or power control circuit 304. The exact method of controlling multiplexer 616 is a matter of design choice.

In this embodiment, comparator circuit 508 comprises XOR-gate 626. XOR-gate 626 has a first input coupled to user data input interconnect 614, a second input coupled to the Q-output of latch 624, and an output coupled to a first input of AND-gate 628.

In this embodiment, activation circuit 510 comprises AND-gate 628 and control element 630. AND-gate 628 has a second input coupled to control element 430 and an output coupled to a first input of OR-gate 432.

In this embodiment, wakeup bus 324 is also distributed and the local portion of it comprises OR-gate 632, wakeup bus input interconnect 634 and wakeup bus output interconnect 636. OR-gate 632 has a second input coupled to wakeup bus input interconnect 634 and an output coupled to wakeup bus output interconnect 636. In this distributed approach, the user I/O buffers are preferably connected together in a series arrangement with the wakeup bus output interconnect 636 of one user I/O buffer coupled to the wakeup bus input interconnect 634 of the next user I/O buffer. The wakeup bus output interconnect 636 of the last user I/O buffer 600 is coupled to the non-distributed balance of the wakeup logic 320 circuitry for evaluation. The wakeup bus input interconnect 634 of the first user I/O buffer 600 can be coupled to a value of logic-0 (typically ground), coupled to a configuration bit, or coupled to the balance of wakeup logic 320 circuitry as a matter of design choice.

This type of distributed arrangement used for implementing wakeup bus 324 is known as an OR-bus. It is a very efficient way to couple together a large number of distributed logic blocks since very little logic is required and only a single wire need to be run from one block to the next. Inactive blocks have their outputs forced to logic-0 so that the active blocks can signal the logic at the end of the series of OR-gates 632 that an anticipated wakeup event has occurred. Persons of ordinary skill in the art will realize that many variations on the exemplary OR-bus of FIG. 6A are possible, for example, adding additional OR-gates to allow different chains of user I/O buffers to return to wakeup logic 320 in parallel, are possible. Such skilled persons will also realize that many other suitable bus structures are known in the art and the choice of the OR-bus for illustrative purposes is in no way limiting.

Multiplexer 616, control element 618, routing multiplexer 620, and latch 624 implement the function of wakeup condition circuit 506 in FIG. 5. In this embodiment, multiplexer 616 is used to select a value from a number of different data sources to save in latch 624 for use by the comparator circuit during a low-power or sleep mode, though many variations are possible within the scope of the invention. For example, more than one control element could be present, or the FPGA designer may assume that the end user will know the normal state of the external pin and not couple input buffer 504 to multiplexer 616, preferring to store the value in the control element 618, or a different number of routing multiplexers (including none at all) might be coupled to multiplexer 616. Configurations where latch 624 is not present are also possible as a matter of design choice.

XOR-gate 626 implements the function of comparator circuit 508 in FIG. 5. Whenever the output of input buffer 504 and the Q-output of latch 624 present the same logic value, XOR-gate 626 presents a logic-0 at its output. Whenever the output of input buffer 504 and the Q-output of latch 624 present different logic values, XOR-gate 626 presents a logic-1 at its output. Depending on the wakeup operation, either a logic-1 or a logic-0 will signify the (possible) detection of a wakeup event.

AND-gate 628 and control element 630 implement the function of the activation circuit 510 of FIG. 5, since they determine if user I/O buffer 400 is actively participating in the wakeup group. Control element 630 could also be replaced by a number of alternative implementations, for example, a multiplexer selecting between multiple control elements, or the output of a routing multiplexer, or a multiplexer and latch combination like that used in the wakeup condition circuit 506. When selected to be active, AND-gate 628 allows the output of the comparator circuit 508 to pass to wakeup bus 324 when the control element 630 presents a logic-1 to the second input of AND-gate 628 sending the result of the compare operation to the remainder of the wakeup logic 320 in FIG. 5. When not selected to be an active part of the wakeup group, AND-gate 628 sends a logic-0 to OR-gate 632 of wakeup bus 324 when the control element 630 presents a logic-0 to the second input of AND-gate 628. This allows the wakeup bus to pass a signal from wakeup bus input interconnect 634 to wakeup bus output interconnect 636 unimpeded causing the non-selected user I/O buffer to be ignored by wakeup bus 324.

For a Wake on Pin Change operation, the control element 630 is programmed to present a logic-1 to the second input of AND-gate 628 to make user I/O buffer 600 an active member of the wakeup group. This will allow the output of XOR-gate 626 to propagate to the first input of OR-gate 432 while a logic-0 will block the output of XOR-gate 626 and present a logic-0 to the first input of OR-gate 632. Thus a change on one or more of the active user I/O outputs in the wakeup group will send a logic-1 to wakeup logic 320 of FIG. 5.

Before the FPGA goes into the low-power or sleep mode, several things are done. First, the value on the external pin is stabilized in its non-active state. The signal value on the external pin is presented at bond pad 602, the output of input buffer 504, and user input data interconnect 614. Second, the control signals (not shown) for multiplexer 616 and latch 624 are manipulated to gate this value into latch 624. Third the control signals for latch 624 are further manipulated to save this value in latch 624 as a reference during the low-power or sleep mode. Then any other steps required to place FPGA 300 into low-power or sleep mode, for example, driving the wakeup bus input interconnect 634 of the first user I/O buffer in the wakeup group to logic-0 to enable the feedback path, can be performed. It should be noted that power is supplied to latch 624, XOR-gate 626, AND-gate 628, control element 630, OR-gate 632 as well as the appropriate portions of FPGA core 302, and power control block 304 during the low-power or sleep mode. It is worth noting that in some embodiments the order of these steps may be different, additional steps may be added, the details of each step may be changed, or one or more steps could be eliminated completely.

During the low-power or sleep mode, if the external pins coupled to the active user I/O buffers 600 of the wakeup group remain in the state they were in upon entering the low-power or sleep mode then XOR-gate 626 and AND-gate 628 will present a logic-0 to the first input of OR-gate 432. Since all of the inputs of all of the OR-gates 632 in all of the user I/O buffers in the wakeup group will initially present a logic-0, then the value logic-0 will be returned to the balance of the wakeup logic 320 circuitry. Since logic-0 is the expected value for no change, no action will be taken.

When any one of the external pins coupled to one of the active user I/O buffers 600 of the wakeup group transitions to the opposite state, XOR-gate 626 in that user I/O buffer 600 will output a logic-1 since the value on its inputs will be logical compliments of each other. This will cause AND-gate 628 and OR-gate 632 of that user I/O buffer 600 to output logic-1 as well. The logic-1 will propagate throughout the rest of the series arrangement of user I/O buffers and be presented to the balance of the wakeup logic 320 circuitry in order to take appropriate action, for example, waking up FPGA 300.

For a Wake on Vector operation, the control element 630 is programmed to present a logic-1 to the second input of AND-gate 628 to make the user I/O buffer an active member of the wakeup group. Before the FPGA goes into the low-power or sleep mode, several things are done. First, the comparison value is determined. This will either be the value stored in control element 618 or a value determined by the end user's logic and presented on the one of the routed tracks 622 selected by routing multiplexer 620. It is also possible to bring the comparison value in from the external pin coupled to bonding pad 502 as in the Wake on Change case. Second, the control signals for multiplexer 616 and latch 624 are manipulated to gate this value into latch 624. Third the control signals for latch 624 are further manipulated to save this value in latch 624 as a reference during the low-power or sleep mode. Then any other steps required to place FPGA 300 into low-power or sleep mode, for example, driving the wakeup bus input interconnect 634 of the first user I/O buffer 600 in the wakeup group to enable the feedback path, can be performed. It should be noted that power is supplied to latch 624, XOR-gate 626, AND-gate 628, control element 630, OR-gate 632 as well as the appropriate portions of FPGA core 302, and power control block 304 during the low-power or sleep mode.

During the low-power or sleep mode, the active user I/O buffers of the wakeup group constantly monitor the state of the external pins they are coupled to. If the state of the external pin matches the value stored in latch 624, then XOR-gate 626 and AND-gate 628 will present a logic-0 to the first input of OR-gate 632. If the state of the external pin does not match the value stored in latch 624, then XOR-gate 626 and AND-gate 628 will present a logic-1 to the first input of OR-gate 632.

If at least one of the AND-gates 628 in any of the active user I/O buffers 600 in the wakeup group present a logic-1, then the value logic-1 will be returned to the balance of the wakeup logic 320 circuitry. Since logic-1 is the expected value for the no vector match condition, no action will be taken. If all of the outputs of all of the AND-gates 628 in all of the user I/O buffers in the wakeup group present a logic-0, then the value logic-0 will be returned to the balance of the wakeup logic 320 circuitry. Since logic-0 is the expected value for a vector match condition, the balance of the wakeup logic 320 circuitry will take the appropriate action, for example, waking up FPGA 300.

Since an address bus may be coupled to a number of different devices, it is possible that the bus could temporarily transition through the vector specifying the address of FPGA 300 while changing between the addresses of two devices that are active while FPGA 300 is in a low-power or sleep mode. In order to avoid this sort of bus glitching causing the part to awaken unnecessarily or at an undesired time, the circuitry in wakeup logic 320 can be designed to respond sufficiently slowly that any address bus glitch will have transitioned to another address before any action is taken and the temporary presence of the matching address on the wakeup group pins can be ignored. This is a matter of design choice and there are many different circuit and logic techniques known in the art for accomplishing this (for example adding a programmable timer for delaying action until the vector match condition remains present for a user specified amount of time).

Persons of ordinary skill in the art will realize there are a number of simplifications in FIG. 6A. For example, the number of routing tracks 622 coupled to routing multiplexer 620 is a matter of design choice and the selection of which input is gated to the output of routing multiplexer 620 is determined by one or more control elements not shown in FIG. 6A. Since many possible FPGA cores are suitable for use with the present invention a detailed discussion of the routing architecture would unnecessarily overcomplicate the disclosure and obscure the inventive aspects of the present invention. Similarly, the control elements 618 and 630 are referred to in the singular, but might physically comprise more than one control element depending on the programming technology employed. Such skilled persons will know that in all FPGA architectures there is a method for programmably presenting either a logic-1 or logic-0 to a particular node as part of the configuration and programming process. Also, the circuitry coupled to the select lines of multiplexer 616 and the control inputs to latch 624 are not shown in FIG. 6A, since the exact design is a function of the overall circuit and logic design of FPGA core 302, power control block 304, and the balance of wakeup logic 320. Persons of ordinary skill in the art will realize that many suitable designs for FPGA core 302, power control block 304 and wakeup logic 320 are possible. Further, such skilled persons will realize that the circuitry presented in FIG. 6A is exemplary only and that many possible user I/O buffer logic designs are capable of implementing the described functionality.

Figure 6B:
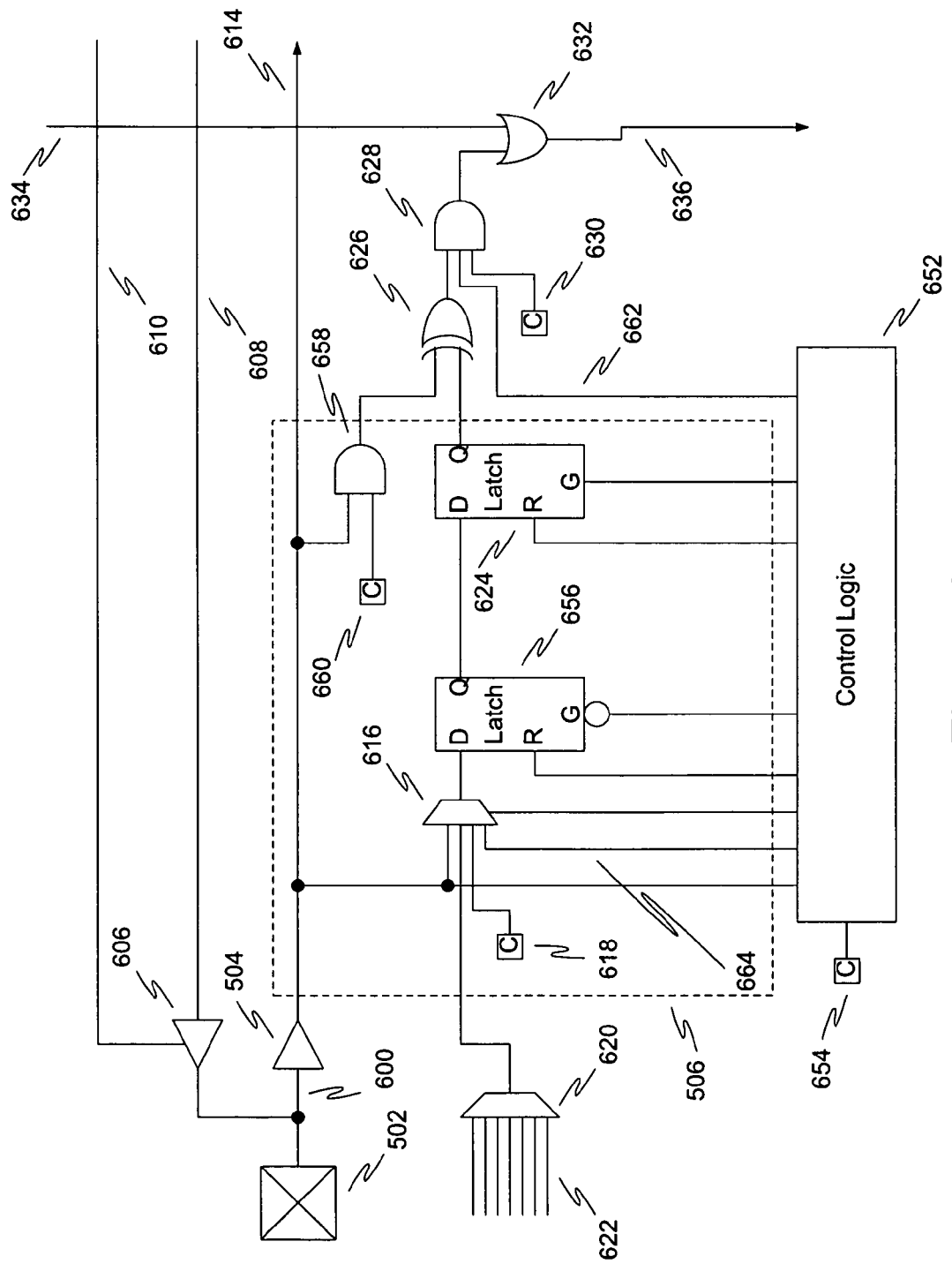
FIG. 6B illustrates a logic diagram of a second embodiment of a user I/O buffer suitable for use with the distributed subsystem of FIG. 5.

While the user I/O buffer of FIG. 6A is capable of supporting the Wake on Pin Change and Wake on Vector modes, additional circuitry is needed to implement the Wake on Transition mode. FIG. 6B shows a user I/O buffer capable of implementing all three modes. Many of the circuits present in FIG. 6B perform the identical or nearly identical function as circuits that have already been described in detail in FIG. 6A and these circuits will be given identical reference numbers.

Present in FIG. 6B is bonding pad 502 which is coupled through interconnect 600 to the output node of output buffer 606. Output buffer 606 has a data input node coupled to the FPGA core 302 through user data output interconnect 608 and an enable input node coupled to the FPGA core 302 through user enable output interconnect 610. The user I/O buffer 400 further comprises input buffer 504, which has an input node coupled to bonding pad 502 through interconnect 600 and an output node coupled to the FPGA core 302 through user data input interconnect 614. User input data interconnect 614 also couples to a first input of control logic block 652.

Multiplexer 616 has a first data input coupled to user input data interconnect 614, a second data input coupled to control element 618, a third data input coupled to the output of routing multiplexer 620, a fourth data input coupled to an output of control logic block 652 through interconnect 664, an output coupled to the D-input of latch 656, and an appropriate number of select line inputs coupled to the same number of outputs of control logic block 652. Routing multiplexer 620 has a number of data inputs coupled to routing tracks 622 in FPGA core 302.

Latch 656 is coupled between multiplexer 616 and latch 624 with the Q-output of latch 656 coupled to the D-input of latch 624. Latches 656 and 624 can be used to form an edge triggered flip-flop for use in the Wake on Transition mode. Each latch 656 and 624 has a G-input and an R-input coupled to outputs of control logic block 652. The logic polarity of the G-input on latch 656 is inverting while the logic polarity of the G-input on latch 624 is non-inverting. The G-inputs are used to gate data into latches 656 and 624, meaning that when gate is asserted the latch becomes transparent and passes the data on the D-input to the Q-output and when gate is de-asserted the latch stores the data on the Q-output and ignores the D-input. The R-input is used to reset the data in latches 656 and 624 to logic-0. This configuration allows latches 656 and 624 to form a resetable D-type flip-flop when the G-inputs are driven by the same logical function or signal (gated through control logic 652).

XOR-gate 626 has a first input coupled to the output of AND-gate 658, a second input coupled to the Q-output of latch 624, and an output coupled to a first input of AND-gate 628. AND-gate 628 has a second input coupled to an output of control logic block 652 through interconnect 662, a third input coupled to control element 630, and an output coupled to a first input of OR-gate 632. OR-gate 632 has a second input coupled to wakeup bus input interconnect 634 and an output coupled to wakeup bus output interconnect 636. AND-gate 658 has a first input coupled to user input data interconnect 614 and a second input coupled to control element 660. Control logic block 652 has a second input coupled to one or more control elements 654.

The user I/O buffer of FIG. 6B can be made to function identically to the user I/O buffer of FIG. 6A when control element 660 presents a logic-1 to the second input of AND-gate 658, the R-input and G-input control inputs are configured to make latch 656 transparent (the G-input being asserted and the R-input being de-asserted), and a logic-1 is asserted on interconnect 662. This is how the user I/O buffer of FIG. 6B performs either a Wake on Pin Change or Wake on Vector operation.

To use the user I/O buffer of FIG. 6B as part of a Wake on Transition operation, logic-1 is asserted on interconnect 662 to the second input of AND-gate 628 and the control element 630 is programmed to present a logic-1 to the third input of AND-gate 628 to make user I/O buffer 650 an active member of the wakeup group. This will allow the output of XOR-gate 626 to propagate to the first input of OR-gate 632 while a logic-0 will block the output of XOR-gate 626 and present a logic-0 to the first input of OR-gate 632. Also, control element 660 is programmed to logic-0 to prevent signals on user input data interconnect 614 from reaching the first input of XOR-gate 426.

Before the FPGA goes into the low-power or sleep mode, several things are done. First, latches 656 and 624 are reset to logic-0. Second, the control signals for multiplexer 616 are manipulated to present a logic-1 to the D-input of latch 656. Third, the desired polarity of the transition is programmed into one of the one or more control elements 654. Fourth, user input data interconnect is routed to the G-inputs of latches 656 and 628 with the desired polarity (so the flip-flop will trigger on which ever edge the user specifies). Then any other steps required to place FPGA 300 into low-power or sleep mode, like, for example, driving the wakeup bus input interconnect 634 of the first user I/O buffer in the wakeup group to logic-0 to enable the feedback path, can be performed. It should be noted that power is supplied to control logic block 652, multiplexer 616, latches 656 and 624, XOR-gate 626, AND-gates 628 and 658, control element 630, OR-gate 632 as well as the appropriate portions of FPGA core 302, and power control block 304 during the low-power or sleep mode.

During the low-power or sleep mode, if the external pins coupled to the active user I/O buffers 650 of the wakeup group stay in the same state or only transition in the undesired direction, a logic-0 will remain in the flip-flop comprising latches 656 and 624. This will cause a logic-0 to propagate through XOR-gate 626, AND-gate 628 and onto the OR-bus formed in part by OR-gate 632. Since all of the inputs of all of the OR-gates 632 in all of the user I/O buffers in the wakeup group will be logic-0, then the value logic-0 will be returned to the balance of the wakeup logic 320 circuitry. Since logic-0 is the expected value for no desired transition, no action will be taken.

When one of the external pins coupled to one of the active user I/O buffers of the wakeup group transitions in the desired direction, a logic-1 will be clocked into the flip-flop comprising latches 656 and 624. The logic-1 will propagate through XOR-gate 626. This will cause AND-gate 628 and OR-gate 632 of that user I/O buffer 650 to output logic-1 as well. The logic-1 will propagate throughout the rest of the series arrangement of user I/O buffers 650 and be presented to the balance of the wakeup logic 320 circuitry in order to take appropriate action like, for example, waking up FPGA 300.

Because the Q-output of latch 624 cannot be directly monitored by the FPGA core 302, wakeup logic 320 makes use of the control logic block 652 to determine which active input in the wakeup group had the desired transition. Interconnect 662 is used to deactivate all but one of the user I/O buffers in sequence to find the one where the flip-flop has had logic-1 clocked into it. This can be done in a number of different ways like, for example, putting the wakeup group in a read back mode and using an address bus coupled to each user I/O buffer to address each one in turn. Interconnect 662 in the addressed user I/O buffer would be driven to logic-1 and to logic-0 in the non-addressed ones allowing the flip-flops to be polled in turn by the OR-bus.

Persons of ordinary skill in the art will realize there are a number of simplifications in FIG. 6B. For example, the number of routing tracks 622 coupled to routing multiplexer 620 is a matter of design choice and the selection of which input is gated to the output of routing multiplexer 620 is determined by an appropriate number of control elements not shown in FIG. 6A. Since many possible FPGA cores are suitable for use with the present invention a detailed discussion of the routing architecture would unnecessarily overcomplicate the disclosure and obscure the inventive aspects of the present invention. Similarly, the control elements 618 and 630 are referred to in the singular, but might physically comprise more than one control element depending on the programming technology employed. Such skilled persons will know that in all FPGA architectures there is a method for programmably presenting either a logic-1 or logic-0 to a particular node as part of the configuration and programming process. Also, the circuitry internal to control logic block 652 has not been discussed in detail, since the exact design is a function of the overall circuit and logic design of FPGA core 302, power control block 304, and the balance of wakeup logic 320. Persons of ordinary skill in the art will realize that many suitable designs for FPGA core 302, power control block 304 and wakeup logic 320 are possible. Further, such skilled persons will realize that the circuitry presented in FIG. 6B is exemplary only and that many possible logic designs are capable of implementing the described functionality.

Figure 7:
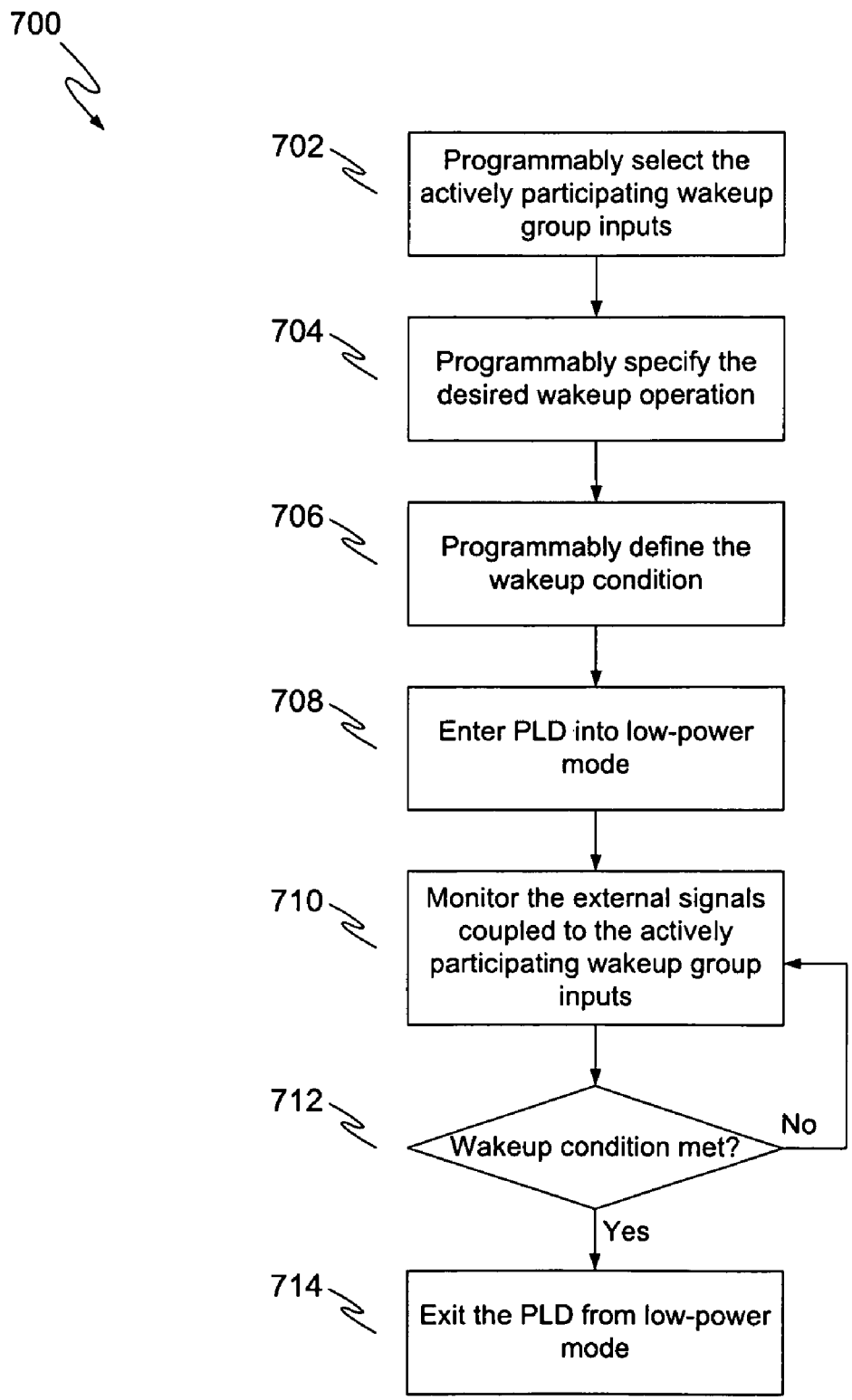
FIG. 7 illustrates a flow chart of a method of using the present invention.

Shown in FIG. 7 is a flowchart 700 summarizing the method of entering and exiting a low-power mode in a PLD with programmable wakeup pins. In step 702 the user programmably selects the actively participating wakeup group inputs. This is accomplished by assigning values to control elements coupled to or associated with the wakeup group pins that will ultimately be applied to the PLD. In some embodiments, this can be indirectly accomplished by using programmable logic to select the active wakeup group inputs during normal operation prior to entering the low-power mode. While most of the exemplary embodiments previously described utilized exemplary user I/O buffers, any input buffer coupled to a bond pad that is coupled to an external signal can be a part of a wakeup group as a matter of design choice. Any number and combination of inputs in a wakeup group may be selected for any operation, and in embodiments where multiple wakeup groups are used this is true for each wakeup group.

In step 704 the user programmably specifies a desired wakeup operation. This may be done as part of programming the PLD by assigning values to control elements that will ultimately be applied to the PLD or accomplished during normal operation by programmable logic (or a combination of both approaches), depending on the embodiment or the choices made by the end user as part of the design. Possible operations include Wake on Change, Wake on Vector, and Wake on Transition, though others are possible. In embodiments where there is more than one wakeup group on the same PLD, a composite wakeup operation can be specified by the end user utilizing either a different or the same operation for each wakeup group.

In step 706 the user defines the wakeup condition to be applied. This may be done as part of programming the PLD by assigning values to control elements that will ultimately be applied to the PLD or accomplished during normal operation by programmable logic (or a combination of both approaches), depending on the embodiment or the choices made by the end user as part of the design. The wakeup condition is appropriate for the wakeup operation. For example, for a Wake on Change operation the wakeup condition is the state of the active inputs prior to the PLD entering sleep mode. For a Wake on Vector operation, the wakeup condition is the input pattern that must be matched. For a Wake on Transition operation, the wakeup condition is generated from the edge specified by the end user on an input-by-input basis.

In step 708 the device enters into a low power mode. This may be done by a combination of hardwired control circuitry (such as power control circuit 304), user specified logic (such as user logic 306), or an off-chip intelligence (such as external system control logic 308). The particulars will vary considerably from one PLD to another, but may include such functions as turning off circuits which draw D.C. power, disconnecting some circuits from the power supplies, backing up the data in sequential elements so it is safe or can be restored after exiting from low-power mode, etc.

In step 710 external signals are monitored by a monitoring circuit (such as wakeup logic 320) coupled to the actively participating wakeup group inputs to determine if the wakeup condition has been detected. The exact method of comparison will vary from embodiment to embodiment, but will involve comparing what is observed externally to the wakeup condition specified by the end user looking for a match to the specified condition. In some embodiments and operations, the user may specify a slow response time to allow a transient match to be ignored and only respond to matches present for greater than the minimum specified amount of time.

In step 712 a decision is made (shown as the inquiry "Wakeup condition met?" in the drawing figure) by the circuitry where the results of the monitoring step are reported. If the wakeup condition is not met, then the looping continues indefinitely. If the wakeup condition is met, the method proceeds to step 714.

In step 714 the device exits from low-power mode. This occurs when the wakeup condition is met and may comprise a reversal of the actions taken in step 708.

While embodiments and applications of this invention have been shown and described, it would be apparent to those of ordinary skill in the art that many more modifications than mentioned above are possible without departing from the inventive concepts herein. For example, while the illustrative examples given have been directed to field programmable gate arrays, such skilled persons will realize the inventive principles set forth herein would equally apply to the more general category of programmable logic devices. The invention, therefore, is not to be restricted except in the spirit of the appended claims.

What is claimed is:

1. A programmable logic integrated circuit device adapted to enter a low-power mode, the device comprising:
 (a) a programmable logic core;
 (b) a power control circuit coupled to the programmable logic core;
 (c) a plurality of wakeup group inputs; and
 (d) a wakeup control logic circuit coupled to the power control circuit, further comprising:
  (i) a plurality of comparator circuits each coupled to a single wakeup group input,
  (ii) a plurality of wakeup condition circuits each coupled to a single comparator circuit,
  (iii) an activation circuit coupled to the comparator circuit; and
  (iv) an evaluation circuit coupled to the comparator circuits and the power control circuit.

2. The programmable logic integrated circuit device according to claim 1, further comprising a low-power mode control input coupled to the power control circuit, wherein:
 (a) the device will enter the low-power mode in response to an external signal transmitted through the low-power mode control input and received in the power control circuit; and
 (b) the device will exit the low-power mode in response to an external signal transmitted through at least one wakeup group input and received in the power control circuit.

3. The programmable logic integrated circuit device according to claim 2, wherein each wakeup group input can be selected to actively participate in the wakeup function.

4. The programmable logic integrated circuit device according to claim 3, wherein: the device exits the low-power mode in response to a specified pattern of external signals applied to the actively participating wakeup group inputs.

5. The programmable logic integrated circuit device according to claim 2, wherein: the device will exit the low-power mode in response to a specified pattern of external signals being present at all of the wakeup group inputs.

6. The programmable logic integrated circuit device according to claim 1, wherein: the device exits the low-power mode in response to a specified pattern of external signals applied to the wakeup group inputs.

7. A method of power management in a programmable logic integrated circuit device adapted to enter a low-power mode, the device having (i) a plurality of wakeup group inputs, (ii) circuitry supporting at least one wakeup operation, and (iii) circuitry for storing a wakeup condition, the method comprising:
 (a) programmably specifying a wakeup operation;
 (b) programmably defining the wakeup condition;
 (c) entering the device into the low-power mode;
 (d) monitoring external signals applied to the wakeup group inputs;
 (e) evaluating each change of state of each external signal being monitored;
 (f) filtering any possible positive evaluations resulting from activity on an inactive wakeup group input; and
 (g) exiting the device from the low-power mode when the wakeup condition is detected.

8. The method of claim 7, wherein at least one of the wakeup group inputs is selectively active, the method further comprising the step of programmably selecting the active wakeup group inputs.

9. The method of claim 8, wherein the wakeup condition is a change in state of a single actively participating wakeup group input.

10. The method of claim 8, wherein the wakeup condition is a specified pattern present at all of the actively participating wakeup group inputs.

11. The method of claim 8, wherein the wakeup condition is a transition in a specified direction at the input of a single actively participating wakeup group input.

12. The method of claim 7, wherein the wakeup condition is a change in state of a single actively participating wakeup group input.

13. The method of claim 7, wherein the wakeup condition is a specified pattern present at all of the actively participating wakeup group inputs.

14. The method of claim 7, wherein the wakeup condition is a transition in a specified direction at the input of a single actively participating wakeup group input.

* * * * *